US005215590A

United States Patent [19]

Hornung

[11] Patent Number: 5,215,590

[45] Date of Patent: Jun. 1, 1993

[54] POWER SUPPLY FOR VACUUM COATING

[75] Inventor: Martin Hornung, Mömlingen, Fed. Rep. of Germany

[73] Assignee: Leybold Aktiengesellschaft, Hanau, Fed. Rep. of Germany

[21] Appl. No.: 928,963

[22] Filed: Aug. 11, 1992

[30] Foreign Application Priority Data

Mar. 23, 1992 [DE] Fed. Rep. of Germany ....... 4209334

[51] Int. Cl.⁵ .......... C23C 14/24

[52] U.S. Cl. .......... 118/726; 118/715

[58] Field of Search .......... 118/715, 726

[56] References Cited

U.S. PATENT DOCUMENTS

| | | | |
|---|---|---|---|
| 2,584,660 | 2/1952 | Bancroft | 118/726 |
| 2,637,298 | 5/1953 | Shapiro | 118/726 |
| 2,996,418 | 8/1961 | Bleil | 118/726 |
| 4,217,855 | 8/1980 | Takagi | 118/726 |

*Primary Examiner*—Richard Bueker

*Attorney, Agent, or Firm*—Felfe & Lynch

[57] ABSTRACT

Transformers (5, 6) are bolted underneath power feeders (4) and each directly connected by a mounting piece (16, 16*a*) against an outside wall (19) of a tank (1) containing evaporator boats for metal vapor deposition. These mounting pieces (16, 16*a*) are electrically connected each to a pole of the secondary winding of each transformer (5, 6) so that a direct contacting of the tank with this pole achieved.

6 Claims, 5 Drawing Sheets

POWER SUPPLY FOR VACUUM COATING

BACKGROUND OF THE INVENTION

The invention relates to a high-vacuum coating apparatus having a tank of an electrically conductive material in which metal is converted to its vaporous phase by means of electrical energy for the performance of a coating process. For the production of a high current, at least one transformer having an iron core, a primary winding and a secondary winding is provided. One pole of the secondary winding is connected by an electrical conductor to a power feeder leading into the tank and the other pole is connected to the tank.

To convert a metal to the vapor phase by electrical energy a high current is necessary. Therefore, coating apparatus of the above kind are usually equipped with several high-current transformers. These transformers have heretofore been located in a pit underneath the high-vacuum coating apparatus. The two poles of the transformers were connected by copper bus bars and high-current cables to the evaporator of the high-vacuum coating apparatus. Especially the connection to the wall of the tank was configured as a bus bar of relatively large area so that heat could be dissipated by convection.

Arranging the transformers in a pit at a considerable distance from the tank involves relatively high costs, especially due to the relatively long high-current conductor that becomes necessary. Furthermore, it leads to the disadvantage that, after being assembled by the manufacturer for test-run purposes, the transformers with their high-current conductors have to be disassembled and later on reassembled at the customer's.

SUMMARY OF THE INVENTION

According to the invention, the transformer is fastened to the outside of the tank in the direct vicinity of the power input. A mounting piece attached to the transformer and bolted to the tank has a connection to the other pole of the secondary winding and is configured for direct contact with the wall of the tank.

By being arranged thus close to the load, the transformers form one structural unit with the tank. The tank can therefore be transported together with the transformers without disassembly. Furthermore, arranging them on the tank brings the result that only very short high-current conductors are needed, which contributes to a substantial reduction in cost. Furthermore, the tank is capable of absorbing heat from the high-current lines, so that the latter do not need to have a great cross section—which is undesirable from the viewpoint of cost—in order to be able to dissipate heat by convection. Since the mounting piece is simultaneously an electrical conductor, the electrical connection between the transformer and tank, usually referred to as a ground connection, is entirely eliminated.

The mounting piece is preferably made angular in shape and disposed with one of its limbs between a bottom end of the iron core of the transformer and a terminal lug connected electrically to the secondary winding and extending out of the transformer.

To contribute to the further simplification of the transformers, an angle bracket not connected to the winding of the transformer is provided on the opposite side of the iron core, in addition to the mounting piece that is connected to a pole of the secondary coil.

The high-vacuum coating apparatus according to the invention can be employed in different coating processes. If it has an evaporator with a plurality of evaporator boats arranged side by side and supplied with electrical energy through a power feeder leading into the tank for the purpose of coating a film carried over a coating cylinder, the transformers can be disposed in two rows one over the other on the tank wall underneath the power feeders and a control console disposed in front of the latter. Such an arrangement is especially compact, because its transformers occupy the available space underneath the control console.

In high-vacuum coating apparatus operating with evaporator boats the power feeder must be configured as longitudinally movable pins so that they can clamp the evaporator boat and compensate for thermal expansion. Such movement is not undesirably limited by the high-current feeder if a highly flexible conductor strap is provided for the connection of one pole of the transformer to the particular feeder. Since the power feeder itself is water-cooled, it can remove heat from the strap, and this permits the strap to have a small cross section, and this in turn favors its flexibility.

In high-vacuum coating apparatus configured as film coating apparatus, with an evaporator bank having numerous evaporators side by side, and requiring several transformers to supply them with power, according to the number of evaporators, each transformer may consist of two individual transformers combined in a single unit. Here the secondaries are connected in parallel, and the mounting piece is in the form of a rail connecting the two terminal lugs of one pole of the secondary winding.

DETAILED DESCRIPTION OF THE PREFERRED EMBODIMENT

Figure 1:
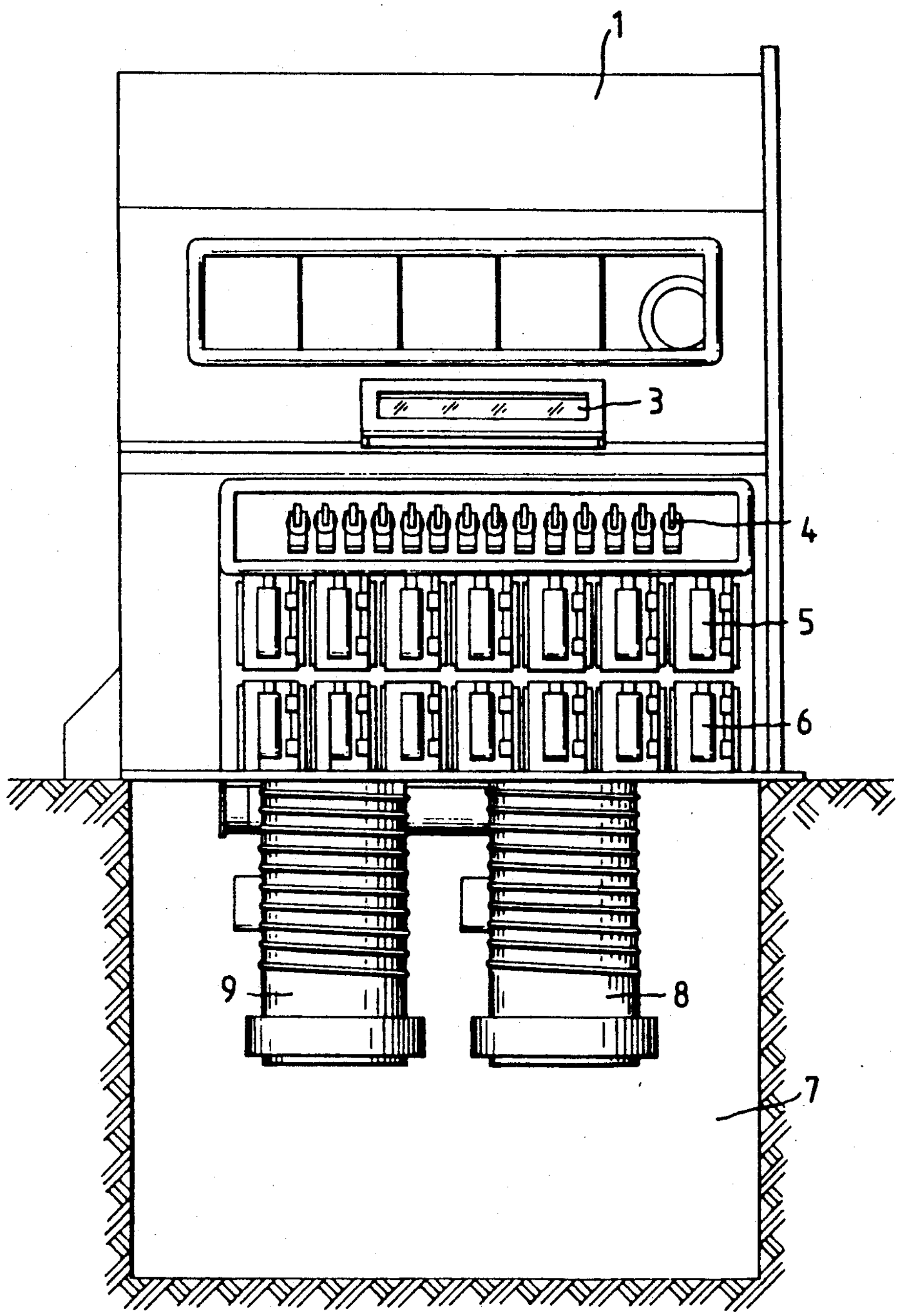
FIG. 1 a front elevation of a high-vacuum coating apparatus according to the invention, FIG. 2 a side view of the high-vacuum coating apparatus, FIG. 3 a side elevation of a transformer of the high-vacuum coating apparatus, FIG. 4 a front elevation of the transformer, FIG. 5 a side view on a much larger scale than in FIG. 2 of a part of the high-vacuum coating apparatus that is important to the invention.

FIG. 1 shows from the side a tank 1 of rectangular cross section, which is designed for coating films. A control console 2 shown in FIG. 2 has been omitted in FIG. 1. Below a window 3 permitting observation of the coating process can be seen a row of power feeders 4 disposed side by side, each connected to one of the transformers 5 and 6 disposed in two rows one above the other. In a pit below the bottom of the tank 1 can be seen two diffusion pumps 8 and 9 by which the interior of the tank 1 can be evacuated.

Figure 2:
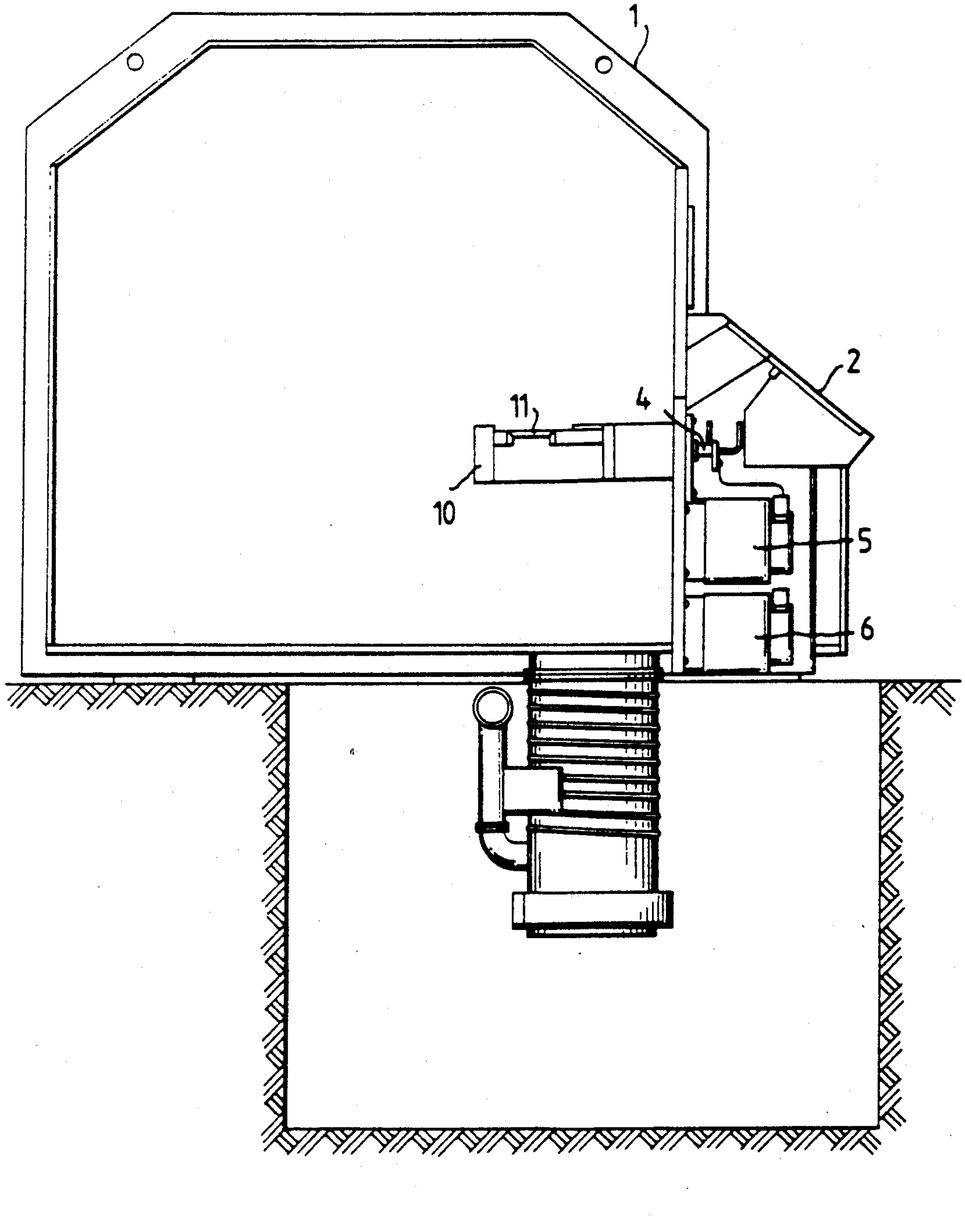

FIG. 2 shows an evaporator bank 10 within the tank 1, with one evaporator boat 11 indicated diagrammatically. Electrical power is fed to this evaporator boat 11 through the power feeder 4. It is important to the invention that the transformers 5 and 6 are fastened directly on the wall of tank 1 underneath the power feeder 4 and the control console 2.

Figure 3:
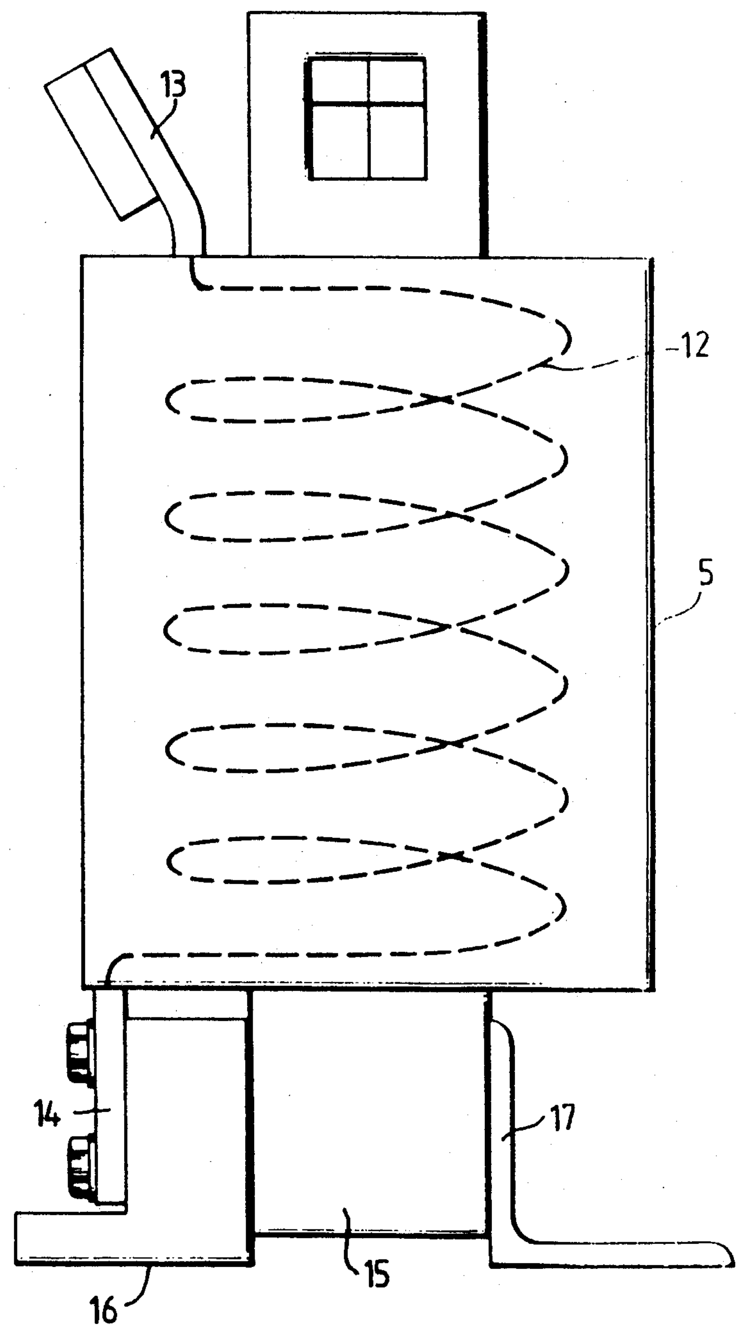

FIG. 3 shows the transformer 5 from the side. In it a secondary winding 12 is indicated diagrammatically whose ends are each connected to a terminal lug 13, 14 of the transformer 5, terminal lug 14 pointing vertically downward. Between this terminal lug 14 and an iron core 15 extending out of the transformer 5 there is provided a mounting piece 16 of a material that is a good electrical conductor (e.g., AlMg 5) in contact with the terminal lug 14. An angle bracket 17 is bolted against the side of the iron core 15 facing away from the mounting piece 16. Both the angle bracket 17 and the mounting piece 16 serve to enable the transformer 5 to be bolted against the outside of the tank 1, thus positively connecting the tank 1 to one pole of the transformer 5 through the mounting piece 16.

Figure 4:
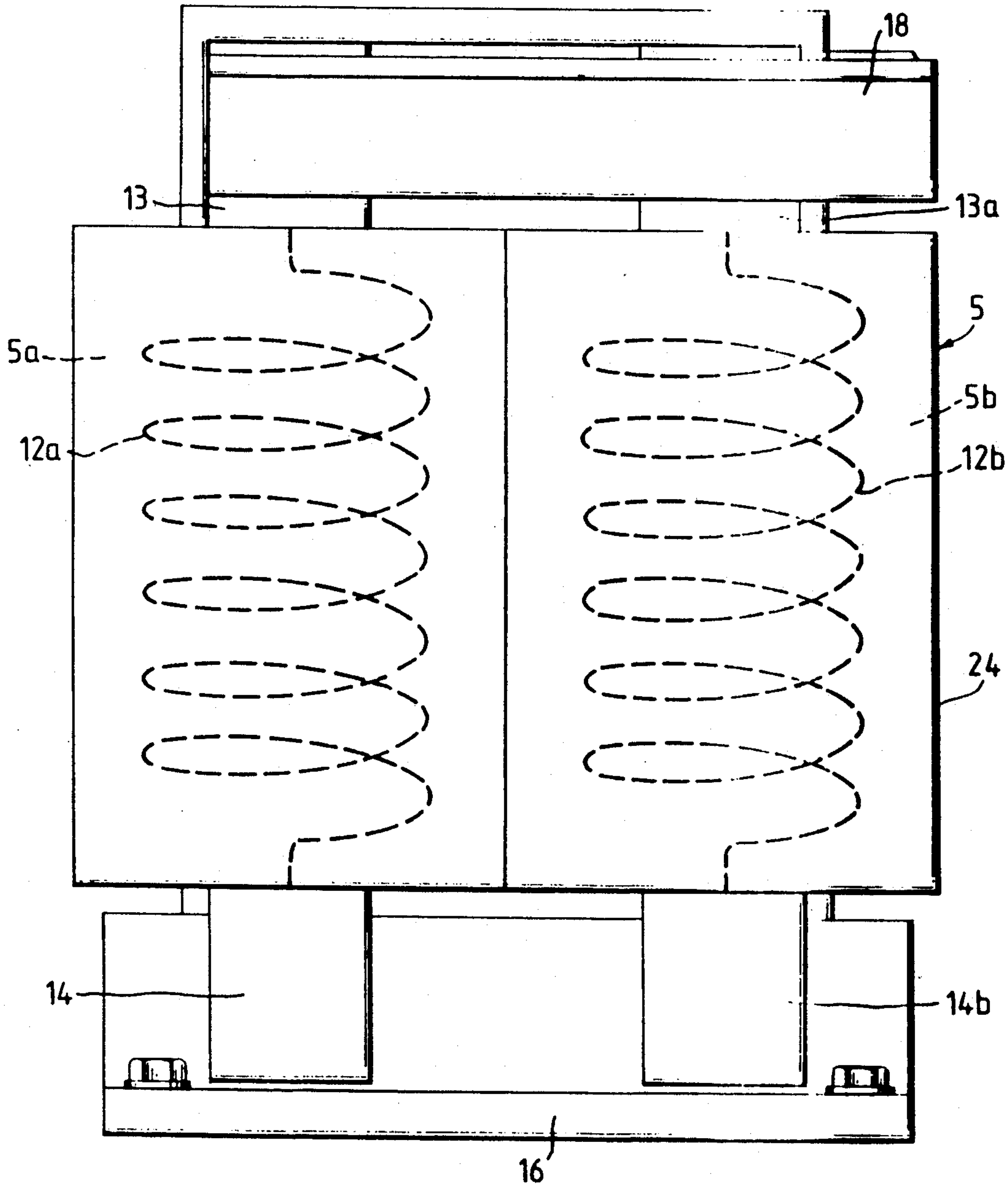

FIG. 4 representing two secondary windings 12 and 12*a* shows that the transformers 5 have two individual transformers 5*a* and 5*b* each in a housing 14 and these are connected in parallel on the secondary side. The mounting piece 16 is in the form of an elongated bracket, so that it is in contact with the connecting lugs 14 and 14*a* of both individual transformers 5*a* and 5*b*. The other two terminal lugs 13 and 13*a* lead to a common bus 18.

Figure 5:
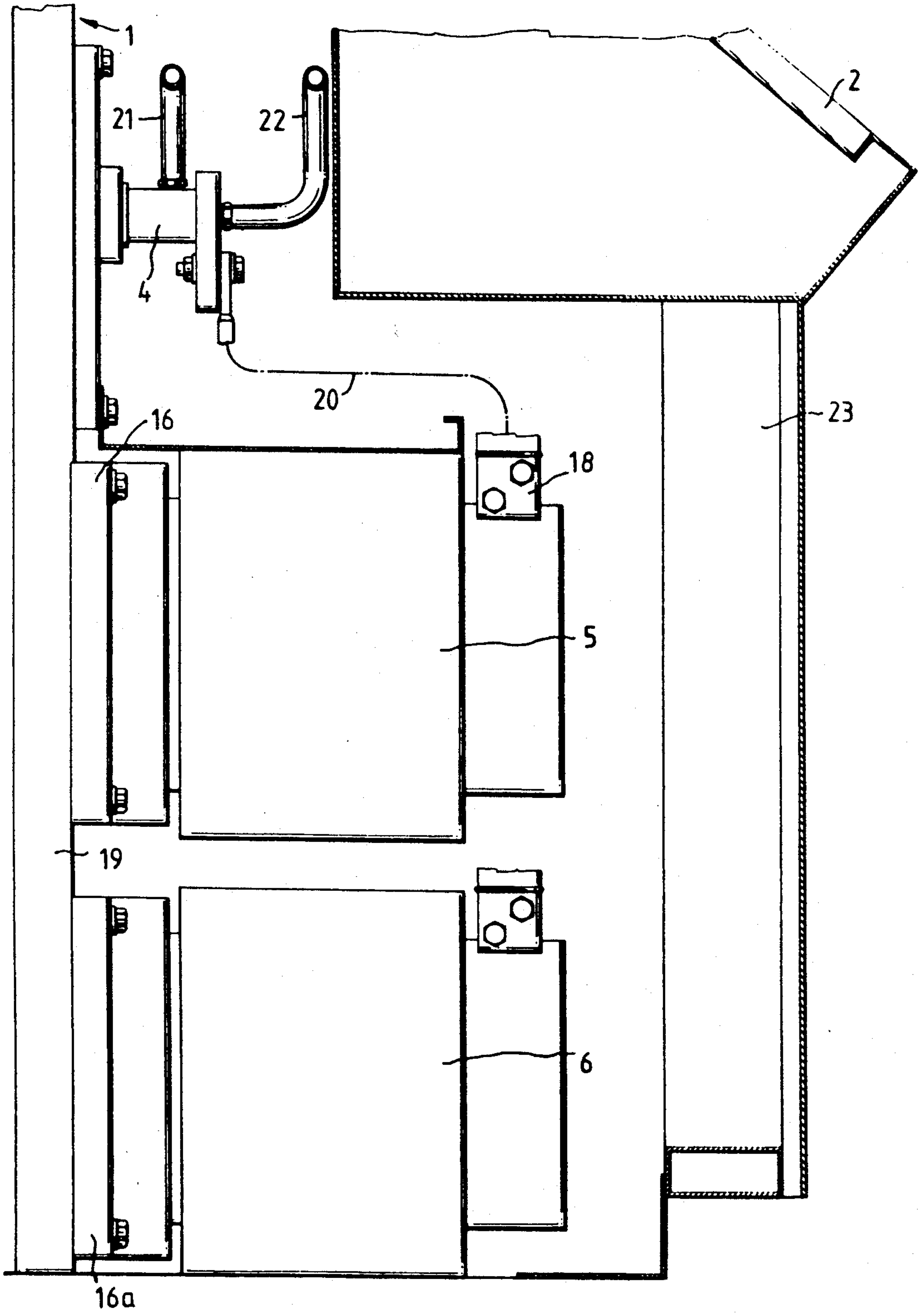

The enlarged view in FIG. 5 shows that part of a wall 19 of the tank 1 against which the transformers 5 and 6 are bolted, contact with the wall 19 being made through the mounting pieces 16 and 16*a*. A flexible strap 20 is indicated in broken lines, which connects the bus 18 of the transformer 5 to the power feeder 4. Tubes 21 and 22 indicate that the power feeder is water-cooled.

Beneath the control console 2 is shown a shield 23 which prevents contact with the transformers 5 and 6 and current-carrying conductors.

I claim:

1. Vacuum coating apparatus comprising a tank having an inside in which metal is converted to its vapor phase and an outside of electrically conductive material, a power feeder mounted to the outside of said tank and having means for feeding power to the inside of said tank, a first transformer mounted to the outside of said tank adjacent to said power feeder, said first transformer having an iron core with a secondary winding thereabout, said secondary winding having first and second poles, said first pole being connected to said power feeder, and a mounting piece which fixes said first transformer to said tank, said mounting piece providing a direct electrical connection between said second pole and the outside of said tank.

2. Vacuum coating apparatus as in claim 1 wherein said second pole comprises a terminal lug connected to said secondary winding and said iron core, and said mounting piece is of angular configuration having two limbs at a right angle, one of said links being electrically connected to said terminal lug, the other limb being connected to said outside of said tank.

3. Vacuum coating apparatus as in claim 2 further comprising a second mounting piece of angular configuration which fixes said first transformer to said tank but is not electrically connected to said secondary winding.

4. Vacuum coating apparatus as in claim 1 wherein said first pole is connected to said power feeder by a flexible strap.

5. Vacuum coating apparatus as in claim 1 further comprising a second transformer mounted to the outside of said tank adjacent to said first transformer, said second transformer having an iron core with a secondary winding thereabout, said secondary winding having first and second poles, said first poles being connected in parallel to said power feeder, said second poles of both said first and second transformers being electrically connected to said mounting piece, said mounting piece serving to mount both said first and second transformers to said outside of said tank.

6. Vacuum coating apparatus as in claim 1 comprising two rows of said first transformers mounted one above the other on said outside wall, each transformer being connected to a respective said power feeder, said apparatus further comprising a plurality of evaporator boats in said tank, each boat being connected to a respective power feeder.

* * * * *